United States Patent [19]

Towell

[11] 3,753,046

[45] Aug. 14, 1973

[54] MULTI-LAYER PRINTED CIRCUIT BOARD

[75] Inventor: Leroy D. Towell, Dallas, Tex.

[73] Assignee: University Computing Company, Dallas, Tex.

[22] Filed: Nov. 3, 1971

[21] Appl. No.: 195,434

[52] U.S. Cl.317/101 CM, 317/101 CC, 317/101 CE, 174/68.5, 161/109, 96/36.2

[51] Int. Cl. .............................................. H05k 1/04

[58] Field of Search .................. 317/101 B, 101 CC, 317/101 CM, 101 CE; 96/36.2, 27, 33; 161/112, 213, 109; 136/3; 174/88 R, 69.5, 117 M; 29/577

[56] References Cited

UNITED STATES PATENTS

| | | | |
|---|---|---|---|
| 3,626,086 | 12/1971 | Rubey | 317/101 CC |
| 3,628,095 | 12/1971 | Schwartz | 317/101 CC |
| 3,644,792 | 2/1972 | Fields | 317/101 CC |
| 3,002,095 | 9/1961 | Ayer | 174/88 R |
| 3,646,572 | 2/1972 | Burr | 174/68.5 |
| 3,366,519 | 1/1968 | Pritchard, Jr. et al. | 174/68.5 |
| 3,478,425 | 11/1969 | Cooke | 174/68.5 |

FOREIGN PATENTS OR APPLICATIONS

| | | | |
|---|---|---|---|
| 1,085,207 | 7/1960 | Germany | 174/685 |

*Primary Examiner*—David Smith, Jr.
*Attorney*—Harold L. Jackson, Joseph W. Price et al.

[57] ABSTRACT

A method and apparatus is disclosed for routing and interconnecting insulated wire to selected areas on a printed circuit board. The apparatus comprises a printed circuit board having land pads located thereon. A wire mat, comprising a quantity of routed wire encapsulated within a layer of photopolymer material, is adapted to extend over the circuit board. The wire mat also includes a plurality of windows formed in areas extending over the land pads in order to permit the wire exposed in those areas to be reflow soldered to the registering land pads. The method of forming the wire mat and the multi-layer printed circuit board comprises the steps of prerouting the insulated wire on a jig board and encapsulating the wire with a quantity of light sensitive photopolymer material. After the windows are formed by washing away masked portions of the photopolymer material, the soldering connections are all made simultaneously.

18 Claims, 5 Drawing Figures

MULTI-LAYER PRINTED CIRCUIT BOARD

BACKGROUND OF THE INVENTION:

1. Field of the Invention:

The present invention relates to printed circuit boards and more particularly to the method and apparatus of interconnecting insulated wire to selected areas on the printed circuit boards.

2. Description of the Prior Art:

Printed circuit boards come in a variety of designs and configurations. A design extensively used today is the multiple layer printed circuit board module in which a plurality of printed circuit boards are stacked in layers and electrically interconnected by busses or the like which extend through punched or plated eyelets. Because of the complexities involved in the structure, such multi-layered configurations do not easily lend themselves to automated production applications. Moreover, the plating process for the eyelets, which often involves gold plating, is quite expensive.

This complexity has been greatly simplified with the advent of "Numerically-Controlled" (NC) wiring systems which eliminated the need for multi-layered boards. One such NC wiring system used successfully utilizes a system for random interconnection of selected areas on a single-sided printed board by providing means for handling, locating and reflow soldering insulated wire to these selected areas on the printed circuit board.

Basic components of such a system for routing and connecting insulated wire to the printed circuit board include a special reflow soldering capillary through which the insulated wire is passed, and an alternating-current power supply for pulse heating the capillary. A tip support system for applying a controlled force to the capillary during the soldering cycle; and a wire feed and support system are also included in the basic components.

In operation, the printed circuit board is positioned on a numerically controlled movable X-Y table. The capillary with insulated wire in place, is then brought into contact with a land area on the printed circuit board. The alternating-current power supply heats the capillary for a predetermined amount of time, which vaporizes the insulation on the wire and causes the solder on the printed circuit board to melt and flow around the exposed wire. After cooling, the capillary is raised from the board with the insulated wire passing through it. The printed circuit board is then moved by the table until the second desired land area is positioned under the capillary. During such movement, the insulated wire is fed from the capillary. When the second land area is positioned under the capillary, the solder connection step is then repeated. This routing procedure is repeated until all of the desired interconnections have been made.

Although such a system is a vast improvement over prior production equipment, the system still suffers from various shortcomings which severely hamper its utilization.

A major problem encountered with such a system is that when a complex circuit is produced by the NC programmed system, the wire is routed and rerouted over the printed board in a scrambled hodgepodge to create a veritable "rat's nest" of wires which is very hard to follow or unscramble. This problem is especially acute when a design change necessitates a rerouting of the wire after the circuit has been produced. With such a system, it is virtually impossible to locate the desired connections to change them.

Moreover, the dual inline packages used in such systems are located on the opposite sides of the circuit board on which the wire routing is located. As a result, these packages must be mounted on plugs equipped with long rods which extend through eyelets or plated passages for connection with the land pads. These connections are made in such a manner that they interfere with any visual inspection of the wire routing. In case of malfunction, therefore, the plugs must be disconnected and removed, which is quite arduous. As a result, it is virtually impossible to repair any malfunctions occurring on the circuit board, and as a general rule, when a malfunction occurs, the entire board is discarded.

A vast improvement over this system has been made by a wire routing system described in U.S. patent application, Ser. No. 885,025, entitled "WIRE ROUTING SYSTEM" and U.S. patent application Ser. No. 32,576 entitled "IMPROVED WIRE ROUTING SYSTEMS". In the system described in these applications a single layered printed circuit board is provided having a plurality of parallel rows or wire land areas having a plurality of wire guide fixtures located between these rows. Each of the fixtures included longitudinally spaced guide posts for receiving portions of insulated wire as it is routed from one land area to another. With such a system, after an initial connection is made, the printed circuit board, which is mounted on a movable X-Y table, is moved in such a manner with respect to the capillary that the insulated wire is strung around the post means located adjacent to the first connection and moved longitudinally along the fixture until the wire reaches the area of the second desired connection. The numerically controlled table then moves the printed circuit board to enable the wire to be strung around the second post means which is adjacent to the second desired land area. The board is then moved slightly to position the capillary over the second land area for reflow soldering the wire thereto. The above procedure is then repeated from the remaining interconnections with the insulated wire being strung or routed around the various guide posts in straight line relationships, i.e., Y-Y directions, until all the desired interconnections have been made.

With such an improved system the routing of the insulated wire over the printed circuit board is greatly simplified in order to make the routing repeatable and repairable. As a result, the scrambled hodgepodge of wires produced by the prior art wiring system is eliminated.

In accordance with the present invention, an alternative proposal for routing insulated wire on a single-sided circuit board is provided that eliminates many of the complexities involved in manufacturing the board, and in addition, is better adapted to high rate production.

SUMMARY OF THE INVENTION

In summarizing the present invention, a multi-layer printed circuit board is provided having a plurality of wire land pads and integrated circuit land pads located on the planar surface of the board. A wire mat is adapted to extend over the surface of the board for providing the wired interconnections between selected wire land pads on the printed circuit board. The wire mat consists of a quantity of insulated wire routed along a predetermined path and encapsulated within a layer of light sensitive photopolymer material. A first group of windows is formed on the wire mat by removing the encapsulating photopolymer from the areas of the mat extending over the wire land pads. The removal of the encapsulating photopolymer in these areas exposes portions of the insulated wire that extend across selected wire land pads in order that they may be reflow soldered to those pads. A second group of windows is formed by removing the encapsulating photopolymer and the included wire segments from the areas of the mat extending over the integrated circuit land pads. This is accomplished to permit the legs of dual incline packages to extend through these windows in order to be reflow soldered to the registering integrated circuit land pads and to segment the single contiguous wire into multiple segments. The printed circuit board also includes a ground plane positioned above and below the wire mat to provide ground leads to each circuit and to provide electrical field isolation for these circuits. A power plane is also positioned on the printed circuit board to provide voltage leads to each circuit. Because of the layered construction of the wire mat, and the ground and voltage planes, the mat assembly requires only a single board surface. Both sides of the printed circuit board can be utilized to accommodate two mat assemblies for the two surfaces.

The wire mat is formed by routing the insulated wire through an array of jig pins located on a jig board. While still positioned on the jig board, the routed wire is encapsulated within the layer of light sensitive liquid photopolymer material. After the photopolymer cures into a solid state, a mask is positioned over the wire mat to prevent light from hardening selected areas of the mat. After the mask selected portions of encapsulating photopolymer is hardened by exposure to a suitable light source, the unhardened photopolymer is washed away with a suitable photopolymer solvent to form the first group of windows. The second group of windows is formed by cutting through the encapsulating photopolymer and the wire included within those areas.

The main advantage of the present invention is that the wire routing, window forming and soldering operations, can be performed at high production rates more easily than heretofore possible. More specifically, the wire routing can be accomplished without interruption by individual soldering steps. The window forming is also accomplished in single step operations. Moreover, the multiple wire solder connections are made simultaneously, rather than individually.

Another advantage of the present invention is that by utilizing both sides of the printed circuit board, the total component capacity is doubled for any given board size.

A further advantage of the present invention is that the wire guide means are removed before the wire mat is connected to the printed circuit board. As a result, the weight and complexities of the assembled printed circuit board are substantially reduced.

The features of the present invention which are believed to be novel are set forth with particularity in the appended claims. The present invention, both as to its organization and manner of operation, together with further objects and advantages thereof, may best be understood by reference to the following description, taken in connection with the accompanying drawings.

Figure 1:
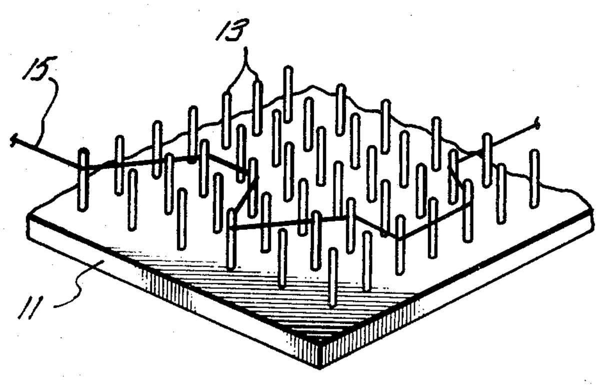
FIG. 1 is a fragmentary perspective view of a quantity of wire being routed over an array of jig pins.

DESCRIPTION OF THE PREFERRED EMBODIMENT:

Referring to the drawings, FIG. 1 shows a jig board 11, having an array of jig pins 13 formed thereon for receiving a quantity of insulated wire 15. The insulated wire 15 is guided through the array of jig pins 13 by a wire feeder (not shown) to form a path that includes all of the predetermined interconnecting points with the wire land areas of a printed circuit board. Although a single length of wire 15 is routed through the array of jig pins 13, the wire 15 will later be cut at various locations to create fragmentary circuit connections. Such an operation will be described in greater detail hereinafter.

After the insulated wire 15 has been routed through the array of jig pins 13, the wire 15 is encapsulated with a layer of liquid light sensitive photopolymer material 19. After the photopolymer cures to the solid state, the jig board 11 is withdrawn from the quantity of encapsulated wire, hereinafter referred to as the "wire mat" 21.

While the wire mat 21 is being formed, a template of photographic mask is placed over the wire mat to shield selected areas from light. This is done because light hardens the light sensitive photopolymer material 19 and the masked out areas are those areas in which it is desired to keep the encapsulated photopolymer soluble for later removal purposes.

Figure 2:
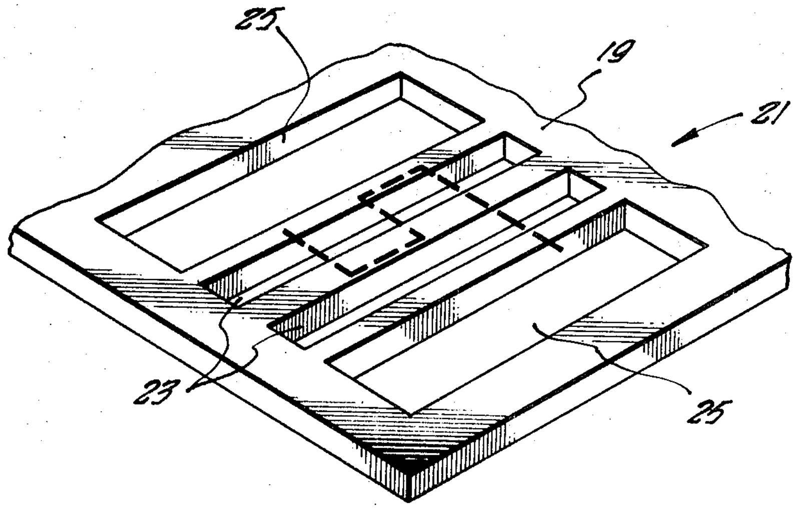
FIG. 2 is a perspective view of a photopolymer encapsulated quantity of wire having a plurality of washed out and cut out window areas.

As shown in FIG. 2, there are two groups of windows formed in the wire mat. The first group of windows 23 are formed by washing away the above-mentioned soluble photopolymer to expose portions of the insulated wire 15. The second group of windows 25 are formed by cutting away both the encapsulating photopolymer 19 and the wire included within the areas. After the windows 23 and 25 are formed, the wire mat 21 is placed over a printed circuit board 27.

Figure 3:
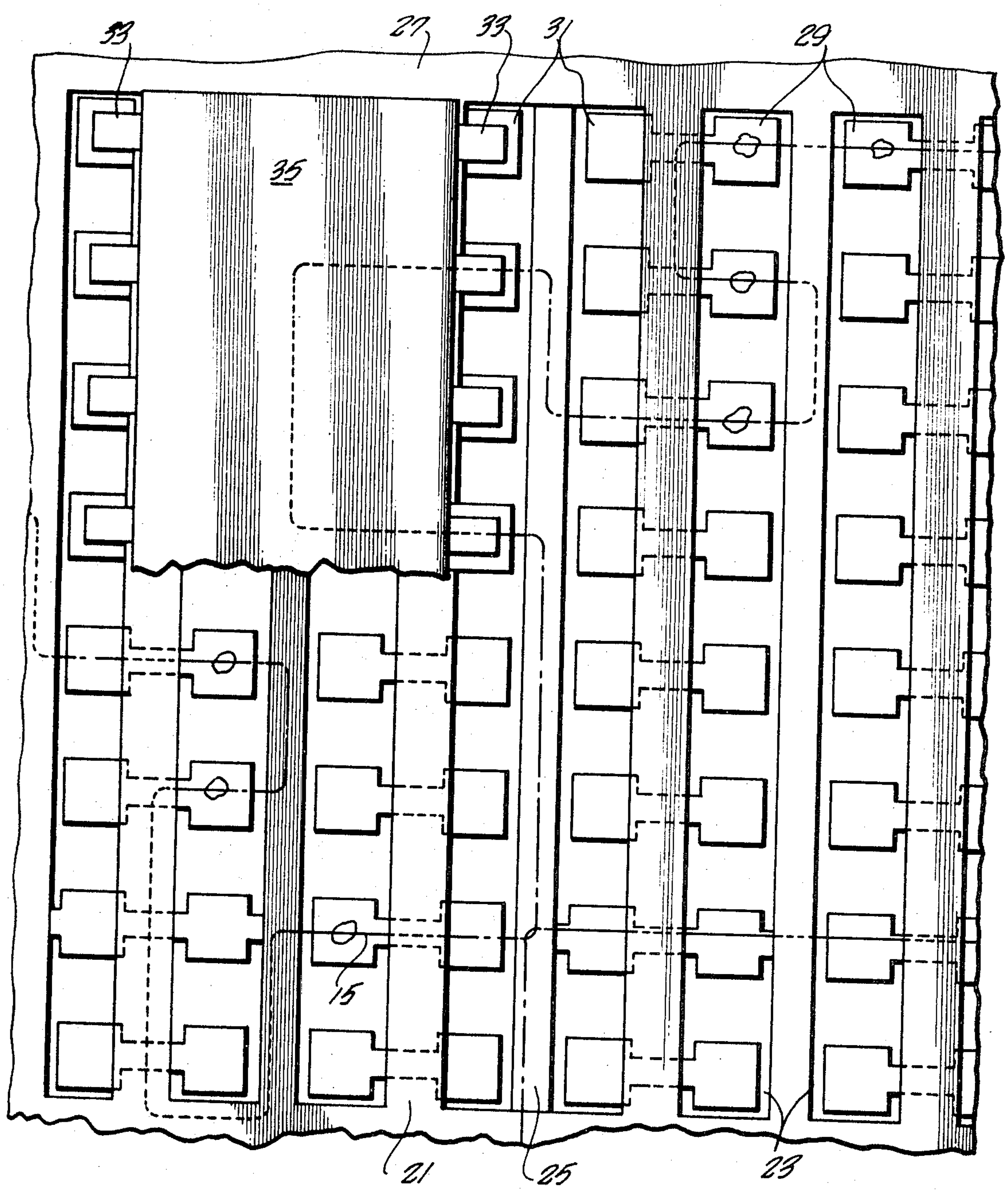
FIG. 3 is a fragmentary elevational view of the wire mat assembly located on a printed circuit board.

As shown in FIG. 3, the printed circuit board includes a plurality of wire land pads 29 and a plurality of integrated circuit land pads 31 formed thereon with the land pads 29 in each row interconnecting with a respective integrated circuit land pad 31. These landing pads 29 and 31 are formed by conventional etched foil techniques and plated with solder.

The wire pad 21 is placed over the printed circuit board in such a position that each window 23 registers with a row of wire land areas 29 and each window 25 registers with two adjoining rows of integrated circuit land pads 31. In FIG. 3 the exposed portions of wire 15 exposed in the windows 23 are shown in solid, while the encapsulated portions of the wire are shown in broken lines. Moreover, the portions of wire that have been removed in the windows 25 are shown in phantom.

After the wire mat 21 is positioned on the printed circuit board 27, a heating tool (not shown) is positioned over the wire mat 21 to move downwardly to contact multiple wire land pads 29. In contacting the wire land pad 29, those pads which have a portion of insulated wire 15 extending thereacross will be soldered together while the other pads which have no exposed portions of wire extending thereacross will merely be heated and subsequently cooled back to its hardened state, as before.

Figure 5:
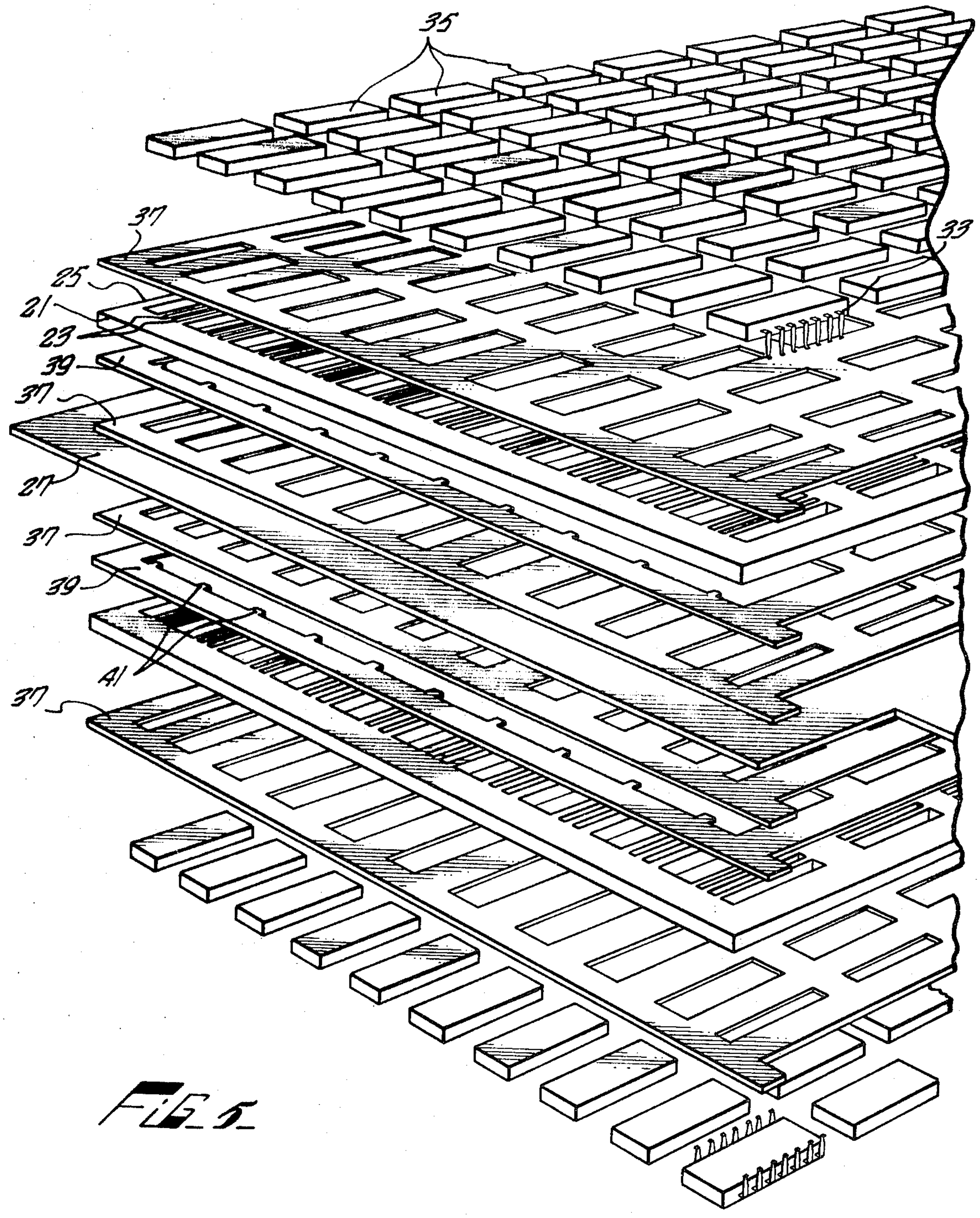
FIG. 5 is a fragmentary exploded view of the wire routing installations located on both sides of the printed circuit board.

A similar heating tool also functions to heat the integrated circuit land pads 31 to permit the legs 33 of a plurality of dual inline packages 35 to be soldered thereto. As shown in FIG. 5, these dual inline packages extend over the entire circuit board 27 with each dual inline package 35 extending over each adjoining pair of rows or wire land areas 29. It should be noted that any desired wire circuit can be made to interconnect the various dual inline packages 35.

Figure 4:
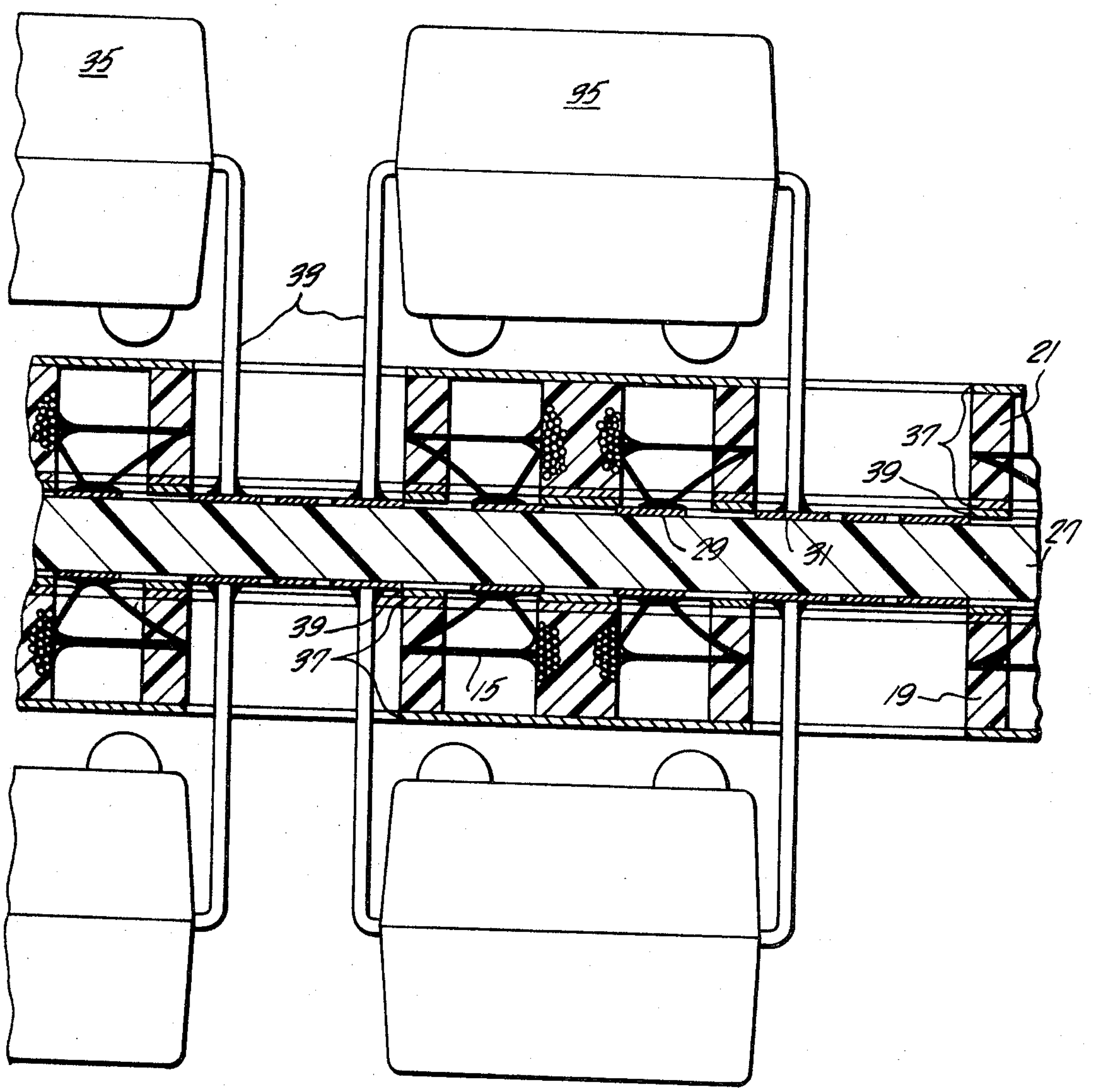
FIG. 4 is a fragmentary sectional view of the wire printed circuit board assembly taken along lines 4—4 of FIG. 3.

As shown in FIGS. 3 through 5 a pair of insulated ground planes 37 are positioned above and below the wire mat 21 prior to placing the wire mat 21 on the printed circuit board 27. These planes 37 not only provide ground leads for each circuit, but also provide insulation for such circuits. Each ground plane 37 is formed of a copper-mylar film, with the copper side of each film being on the interior sides thereof and the insulative mylar film being located on the exterior sides of each pair of ground planes 37.

A voltage or power bus 39 is also positioned on the printed circuit board 27 prior to engaging the wire mat to the printed circuit board. The power bus 39 comprises a mylar film having a current conductor etched thereon with the cut out portions formed thereon to permit the rows of dual incline packages to extend therethrough. Tabs 41 extend into each cavity to electrically contact one leg 33 of each dual inline package 35. The advantages of such ground planes 37 and voltage planes 39 are that they can be easily fabricated and, lying in a flat position, do not obstruct the soldering process or any visual inspections of the circuits.

In fabricating the wire mat 21, the entire routing for all of the circuits is done in a single step without the need of stopping the routing to cut the wire or reflow solder it to the circuit board. In a like manner, the window forming processes are accomplished in single cutting or washing operations. After the voltage and lower ground planes are mounted on the circuit board, the wire mat is positioned on the board as shown in FIG. 3. Afterwhich a heating tool (not shown) is lowered to simultaneously heat multiples of the wire land pads. A similar heating tool (not shown) reflows the integrated circuit land pads. In this manner, the wires exposed in the first group of windows are reflow soldered to the registering wire land pads, while the integrated circuit land pads are heated to receive the legs of the dual inline packages. After cooling, the upper ground plane is mounted on the assembly.

As shown in FIGS. 4 and 5, because of the layered construction of the various components, only a single board surface is required, and both sides of the printed circuit board can now be utilized, thereby doubling the component density for any given board size.

An important advantage of the present invention is that the entire wire routing can now be accomplished without interruption of individual soldering steps. Here the wire routing is completed first and then all the wire solder connections are made in a single step. As a result the wire routing is achieved more rapidly and the wire soldering is accomplished more efficiently.

It should be noted that various modifications can be made to the apparatus while still remaining within the purview of the following claims.

What is claimed is:

1. A multi-layered circuit board adapted to accommodate integrated circuit units comprising:

a printed board having a plurality of wire land areas and integrated circuit land areas mounted on its surface;

a sheet of conducting material adapted to provide a voltage source connected to the printed board;

means for providing a ground plane; and a layer of photopolymer material including a wire mat, the wire of the mat having a predetermined pattern encapsulated in the layer, the photopolymer layer having at least a first opening aligned with at least some of the wire land areas with at least some of the wires extending out of one surface of the photopolymer layer in the side of the opening and extending across the opening into the other side surface of the photopolymer layer, at least some of the wires electrically connected to the wire land areas, the photopolymer layer further having at least a second opening adapted to extend over the integrated circuit land areas whereby integrated circuit units can be attached to the printed board.

2. The invention of claim 1 wherein the sheet of conducting material is positioned between the printed board and the layer of photopolymer material.

3. The invention of claim 1 wherein said wire include an outer layer of insulation.

4. The invention of claim 1 wherein said encapsulating material comprises a light sensitive photopolymer material.

5. The invention of claim 1 wherein said wire land areas are formed by conventionally etched foil techniques and plated with solder.

6. The invention of claim 1 wherein said integrated circuit land areas are formed by conventionally etched foil techniques and plated with solder.

7. The invention of claim 1 further comprising means for insulating said wire mat.

8. The invention of claim 1 wherein said sheet of conducting material comprises a layer of insulative material having current conductors mounted thereon.

9. The invention of claim 1 wherein said wire land areas are mounted on both sides of the printed board, and an encapsulated wire mat is located on both sides of the printed board.

10. The invention of claim 2 wherein the means for providing a ground plane includes a sheet of conducting material positioned between the printed board and the layer of photopolymer material.

11. The invention of claim 2 wherein some of the wires in the first opening extend towards the printed board from the side surface of the first opening while others extend parallel to the printed board across the opening.

12. The invention of claim 11 wherein the second opening does not have any wires extending across the opening.

13. The invention of claim 12 wherein said printed circuit board further comprises a plurality of dual inline packages having a plurality of legs extending through the second group of windows.

14. The invention of claim 12 wherein said wire land areas and said integrated circuit land areas are electrically interconnected, via a narrower heat flow restriction, to impead the heat transfer from one wire land to the other wire land.

15. The invention of claim 14 wherein said wire land areas and said integrated circuit land areas are arranged in parallel rows on said printed board.

16. The invention of claim 7 wherein said insulation means comprises a pair of ground planes located on both sides of said wire mat, each ground plane having an exterior layer of insulative material.

17. The invention of claim 16 wherein the ground planes further comprise ground leads on the interior sides thereof contacting selected integrated circuit land areas.

18. A multi-layered circuit board adapted to accommodate integrated circuit units comprising:

a printed board having a plurality of wire land areas and integrated circuit land areas mounted on its surface;

a layer of photopolymer material including a wire mat, the wire of the mat having a predetermined pattern encapsulated in the layer, the photopolymer layer having at least a first opening aligned with at least some of the wire land areas with at least some of the wires extending out of one surface of the photopolymer layer in the side of the opening and extending across the opening into the other side surface of the photopolymer layer, at least some of the wires electrically connected to the wire land areas, the photopolymer layer further having at least a second opening free from any wires across the opening adapted to extend over the integrated circuit land areas whereby integrated circuit units can be attached to the printed board, a sheet of insulated conducting material positioned on the surface of the printed board and between the printed board and the layer of photopolymer material adapted to provide a voltage source connected to the printed board; and a pair of ground planes located on both sides of the layer of photopolymer material, each ground plane having an exterior layer of insulative material.

* * * * *